US011186178B2

(12) United States Patent
Kosugi et al.

(10) Patent No.: US 11,186,178 B2
(45) Date of Patent: Nov. 30, 2021

(54) MONITORING SYSTEM, SERVER, TERMINAL DEVICE, MONITORING METHOD, AND STORAGE MEDIUM

(71) Applicant: InsuRTAP Inc., Tokyo (JP)

(72) Inventors: Shinichiro Kosugi, Tokyo (JP); Hiroshi Hanafusa, Tokyo (JP); Hideki Tanabe, Tokyo (JP); Yusuke Mori, Tokyo (JP)

(73) Assignee: InsuRTAP Inc.

( * ) Notice: Subject to any disclaimer, the term of this patent is extended or adjusted under 35 U.S.C. 154(b) by 283 days.

(21) Appl. No.: 16/462,315

(22) PCT Filed: Nov. 14, 2017

(86) PCT No.: PCT/JP2017/040846
§ 371 (c)(1),
(2) Date: May 20, 2019

(87) PCT Pub. No.: WO2018/096969
PCT Pub. Date: May 31, 2018

(65) Prior Publication Data
US 2019/0280496 A1 Sep. 12, 2019

(30) Foreign Application Priority Data

Nov. 24, 2016 (JP) .............................. JP2016-228008

(51) Int. Cl.
*B60L 3/00* (2019.01)
*G01R 31/396* (2019.01)
(Continued)

(52) U.S. Cl.
CPC .............. *B60L 3/00* (2013.01); *G01R 31/396* (2019.01); *G01R 31/52* (2020.01); *H01M 10/42* (2013.01);
(Continued)

(58) Field of Classification Search
USPC ....................................................... 320/107
See application file for complete search history.

(56) References Cited

U.S. PATENT DOCUMENTS 6,664,000 B1 12/2003 Sonobe
2009/0018785 A1* 1/2009 Huseth ............... G01R 31/3648
702/63
(Continued)

FOREIGN PATENT DOCUMENTS

JP 2000-060025 A 2/2000
JP 2001-102092 A 4/2001
(Continued)

OTHER PUBLICATIONS

International Search Report corresponding to PCT/JP2017/040846 dated Feb. 6, 2018 (2 pages).
(Continued)

*Primary Examiner* — Mohammed Alam
(74) *Attorney, Agent, or Firm* — Harness, Dickey & Pierce, P.L.C.

(57) ABSTRACT

This invention provides a technique for suppressing deterioration in the value of a power storage system. This invention provides a monitoring system comprising: a detection unit that detects that a detection value related to a power storage system satisfies a condition; a specifying unit that specifies the type of prohibited action executed in the power storage system that satisfies the condition; and a determination unit that, on the basis of the specified type of prohibited action, calculates the life of the power storage system and/or determines the time over which the power storage system can keep operating after the specification.

19 Claims, 9 Drawing Sheets

(51) Int. Cl.
  H01M 10/42 (2006.01)
  H01M 10/44 (2006.01)
  H01M 10/48 (2006.01)
  H02J 7/00 (2006.01)
  H02J 7/02 (2016.01)
  G01R 31/52 (2020.01)
  B60L 58/22 (2019.01)
  B60L 58/30 (2019.01)

(52) U.S. Cl.
  CPC ......... *H01M 10/425* (2013.01); *H01M 10/44* (2013.01); *H01M 10/48* (2013.01); *H02J 7/0026* (2013.01); *H02J 7/02* (2013.01); *B60L 58/22* (2019.02); *B60L 58/30* (2019.02); *H01M 2010/4271* (2013.01); *H02J 7/00* (2013.01)

(56) References Cited

U.S. PATENT DOCUMENTS

| | | | |
|---|---|---|---|
| 2010/0121587 | A1 | 5/2010 | Vian et al. |
| 2012/0130655 | A1 | 5/2012 | Mitsuda et al. |
| 2012/0175953 | A1* | 7/2012 | Ohkawa .................. B60L 58/14 307/18 |
| 2015/0048797 | A1* | 2/2015 | Song ...................... H02J 7/0031 320/134 |
| 2015/0236535 | A1* | 8/2015 | Suzuki ................ H01M 50/572 320/112 |
| 2019/0190268 | A1* | 6/2019 | Hirano .................... H02J 13/00 |
| 2019/0280496 | A1* | 9/2019 | Kosugi ............... H01M 10/425 |

FOREIGN PATENT DOCUMENTS

| | | |
|---|---|---|
| JP | 2002-165385 A | 6/2002 |
| JP | 2002-230303 A | 8/2002 |
| JP | 2008-76295 A | 4/2008 |
| JP | 2010-60323 A | 3/2010 |
| JP | 2012-127938 A | 7/2012 |
| JP | 2012-252823 A | 12/2012 |
| JP | 2013-073897 A | 4/2013 |
| JP | 2014-17901 A | 1/2014 |
| JP | 2014-197542 A | 10/2014 |
| JP | 2015-501474 A | 1/2015 |
| JP | 2015-119580 A | 6/2015 |
| JP | 2016-082877 A | 5/2016 |
| WO | WO-2012/164947 A1 | 12/2012 |
| WO | 2014-045745 A1 | 3/2014 |

OTHER PUBLICATIONS

Written Opinion corresponding to PCT/JP2017/040846 dated Feb. 6, 2018 (10 pages).

Extended European Search Report issued in European Patent Application No. 17873322.6, dated Dec. 18, 2019, 6 pages.

JP Decision to Grant corresponding to JP2020-077127 dated Mar. 23, 2021 (5 pages).

Japanese Decision to Grant issued in Japanese Patent Aplication No. 2018-552510, dated Mar. 31, 2020, 4 pages.

* cited by examiner

| MALFUNCTION TYPE | OPERATION-CONTINUABLE TIME |
|---|---|
| ⋮ | ⋮ |

Fig. 12

| PROHIBITED ACTION TYPE | OPERATION-CONTINUABLE TIME |
|---|---|
| ⋮ | ⋮ |

MONITORING SYSTEM, SERVER, TERMINAL DEVICE, MONITORING METHOD, AND STORAGE MEDIUM

CROSS-REFERENCE TO RELATED APPLICATIONS

This application is a national stage application of International Application No. PCT/JP2017/040846 entitled "Monitoring System, Server, Terminal Device, Monitoring Method, and Storage Medium" filed on Nov. 14, 2017, which claims priority to Japanese Patent Application No. 2016-228008 filed on Nov. 24, 2016, the disclosures of which are hereby incorporated by reference in their entirety.

TECHNICAL FIELD

The present invention relates to a technology of monitoring a power storage system.

BACKGROUND ART

PTL 1 discloses a premium determination device collecting a parameter (for example, speed) related to driving status of an automobile and determining a premium, based on the collected information.

PTL 2 discloses a system allowing charging status to be checked through a device such as a smartphone while a battery on an electric vehicle is charged by a charger.

CITATION LIST

Patent Literature

PTL 1: Japanese Unexamined Patent Application Publication No. 2002-230303
PTL 2: Japanese Translation of PCT International Application Publication No. 2015-501474

SUMMARY OF INVENTION

Technical Problem

A technology for suppressing an unexpected decline in a value of a power storage system (for example, a decline exceeding a decline in a value based on use by a predetermined method) is required. For example, a leasing company leasing a power storage system, a financial institution leasing money with a power storage system as security, and the like want suppression of an unexpected decline in a value of the power storage system. An object of the present invention is to provide a technology for suppressing a decline in a value of a power storage system.

Solution to Problem

According to the present invention, a monitoring system comprising: detection means for detecting that a detection value related to a power storage system satisfies a condition; specifying means for specifying a type of a prohibited action executed in the power storage system satisfying the condition; and determination means for, based on a specified prohibited action type, performing at least either of calculation of a lifetime of the power storage system and determination of an operation-continuable time of the power storage system after specification is provided.

According to the present invention, a monitoring system, comprising a terminal device and a server, wherein the terminal device includes the detection means, the terminal device or the server includes the specifying means, and the server includes the determination means is provided.

According to the present invention, the server is provided.

According to the present invention, the terminal device is provided.

According to the present invention, a monitoring method comprising: detecting that a detection value related to a power storage system satisfies a condition; specifying a type of a prohibited action executed in the power storage system satisfying the condition; and, based on a specified prohibited action type, performing at least either of calculation of a lifetime of the power storage system and determination of an operation-continuable time of the power storage system after specification is provided.

According to the present invention, a storage medium having a program stored thereon, the program causing a computer to function as: detection means for detecting that a detection value related to a power storage system satisfies a condition; specifying means for specifying a type of a prohibited action executed in the power storage system satisfying the condition; and determination means for, based on a specified prohibited action type, performing at least either of calculation of a lifetime of the power storage system and determination of an operation-continuable time of the power storage system after specification is provided.

Advantageous Effects of Invention

The present invention is able to suppress a decline in a value of a power storage system.

BRIEF DESCRIPTION OF DRAWINGS

FIG. 12 is a diagram schematically illustrating an example of information handled by a monitoring system according to an example embodiment of the present invention.

EXAMPLE EMBODIMENT

First Example Embodiment

First, an overview of a first example embodiment will be described. When a malfunction occurs in a power storage system, a monitoring system according to the present example embodiment determines a subsequent operation-continuable time, based on a type of the occurring malfunction. In such a case, the power storage system may continue an operation as-is after the occurrence of the malfunction. Then, when an operation duration time exceeds the operation-continuable time, the monitoring system may stop the operation of the power storage system.

When the occurring malfunction is a severe malfunction, the operation of the power storage system may be immediately stopped. In other words, only when a slight malfunction occurs, an operation-continuable time may be determined and the operation may be continued as-is.

Thus, when a malfunction occurs, the monitoring system according to the present example embodiment does not uniformly stop an operation of the monitoring system and can perform processing of immediately stopping the operation or stopping the operation after leaving the operation as-is for a certain period of time (operation-continuable time) depending on the malfunction type. By appropriately determining an operation-continuable time, based on a malfunction type, the operation of the power storage system may be stopped after occurrence of a slight malfunction before occurrence of a severe secondary malfunction.

Thus, the monitoring system according to the present example embodiment can improve utilization efficiency of a power storage system while securing safety.

A "malfunction" may be a concept including a "failure." In other words, a malfunction may be a concept including a failure and other malfunctions. Alternatively, a "malfunction" may be synonymous with a "failure." In other words, a malfunction may mean a failure.

Next, an example of a hardware configuration of the monitoring system according to the present example embodiment will be described. Each functional unit included in the monitoring system according to the present example embodiment is provided by any combination of hardware and software mainly including, in any computer, a central processing unit (CPU), a memory, a program loaded on the memory, a storage unit, such as a hard disk, storing the program (also capable of storing a program downloaded from a storage medium such as a compact disc [CD], a server on the Internet, and the like in addition to a program previously stored in a shipping stage of the device), and a network connection interface. Then, it is understood by a person skilled in the art that various modified examples of a method and a device providing the functional unit exist.

Figure 1:
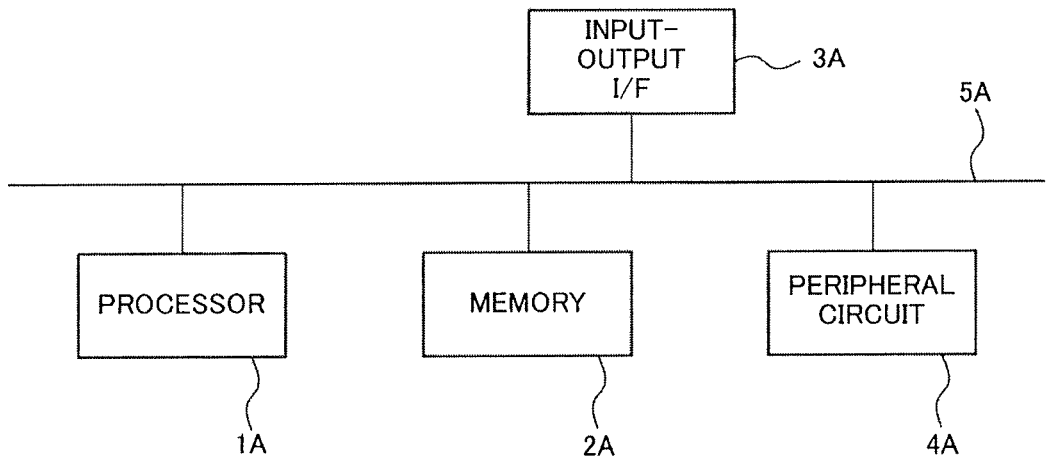
FIG. 1 is a diagram conceptually illustrating an example of a hardware configuration of a device according to an example embodiment of the present invention.

FIG. 1 is a block diagram illustrating a hardware configuration of a monitoring system according to the present example embodiment.

As illustrated in FIG. 1, the monitoring system includes a processor 1A, a memory 2A, an input-output interface 3A, a peripheral circuit 4A, and a bus 5A. Various modules are included in the peripheral circuit 4A. The monitoring system may not include the peripheral circuit 4A.

The monitoring system may be provided by one device or may be provided by a plurality of devices physically and/or logically separated from one another. In the case of the latter, each of the plurality of devices may include a hardware configuration as illustrated in FIG. 1. Then, the plurality of devices may cooperate and provide functions of the monitoring system.

The bus 5A is a data transmission channel for mutual data transmission and reception by the processor 1A, the memory 2A, the peripheral circuit 4A, and the input-output interface 3A. For example, the processor 1A is an arithmetic processing device such as a CPU or a graphics processing unit (GPU). For example, the memory 2A is a memory such as a random access memory (RAM) or a read only memory (ROM). The input-output interface 3A includes an interface for acquiring information from an input device (for example, a keyboard, a mouse, and a microphone), an external device, an external server, and an external sensor, and an interface for outputting information to an output device (for example, a display, a speaker, a printer, and a mailer), an external device, and an external server. The processor 1A may give an instruction to each module and based on the operation result, perform an operation.

Figure 2:
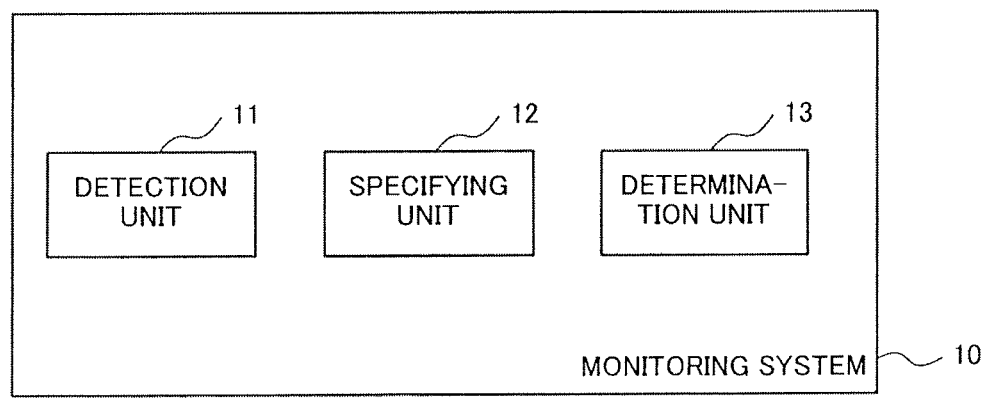
FIG. 2 is an example of a functional block diagram of a monitoring system according to an example embodiment of the present invention.

Next, functions of the monitoring system according to the present example embodiment will be described in detail. FIG. 2 illustrates an example of a functional block diagram of a monitoring system 10 according to the present example embodiment. As illustrated, the monitoring system 10 includes a detection unit 11, a specifying unit 12, and a determination unit 13.

Figure 3:
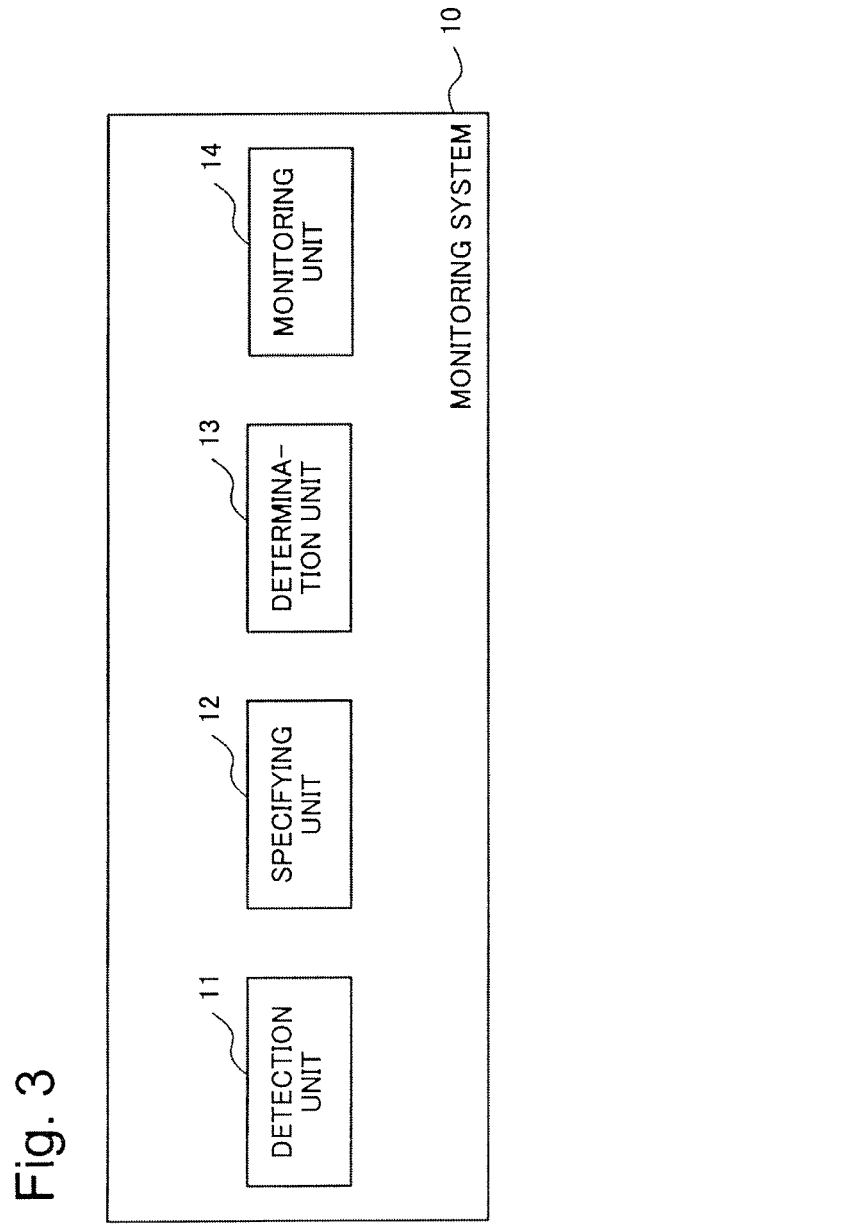
FIG. 3 is an example of a functional block diagram of a monitoring system according to an example embodiment of the present invention.

FIG. 3 illustrates another example of a functional block diagram of the monitoring system 10 according to the present example embodiment. As illustrated, the monitoring system 10 may include a monitoring unit 14 in addition to the detection unit 11, the specifying unit 12, and the determination unit 13.

The functional block diagram illustrates function-based blocks rather than a hardware-based configuration. Identical components are given an identical sign, and description is omitted as appropriate. Each functional unit will be described in detail below.

The detection unit 11 detects that a detection value related to a power storage system satisfies a condition. A detection value is a value for detecting a malfunction occurring in the power storage system. The detection unit 11 can acquire a detection value from the power storage system, a sensor installed in the power storage system, or the like.

For example, detection values may include a current value and a voltage value of the entire power storage system, a current value, a voltage value, and an insulation resistance value of each cell stack, a voltage value of each cell, an execution time (an execution time of discharging processing until a cell voltage reaches an intended value; hereinafter the same) of cell balancing in each cell, a time between cell balancing and subsequent cell balancing (an interval time), the temperature of the power storage system, a concentration of predetermined gas, an image, an output value of an opening-closing sensor detecting opening and closing of a door included in the power storage system, an output value of a vibration sensor detecting a vibration occurring in the power storage system, an output value of a submergence sensor installed in a predetermined position in the power storage system, and a communication retry count in communication between the power storage system and a server.

The aforementioned exemplifications are strictly examples and detection values are not limited to the above.

Conditions are classified into a first condition and a second condition. A first condition is a condition for detecting a slight malfunction. A second condition is a condition for detecting a severe malfunction. Each condition may be determined by one of or a combination of a plurality of the detection values as described above.

For example, "a concentration of predetermined gas being greater than or equal to a predetermined value" may be determined as a second condition. Thus, a leak of predetermined gas from a power storage system may be detected as a severe malfunction. In addition, for example, "the temperature of a power storage system being greater than or equal to a predetermined value" may be determined as a second condition. Thus, a temperature rise in the power storage system may be detected as a severe malfunction. The exemplified second conditions are strictly examples and a second condition is not limited to the above.

Furthermore, for example, "an insulation resistance value of a cell stack being less than or equal to a predetermined value" may be determined as a first condition. Thus, an unusual change in the insulation resistance in the cell stack may be detected as a slight malfunction. In addition, for example, "a communication retry count being greater than or equal to a predetermined count within a predetermined period of time" may be determined as a first condition. Thus, a communication failure in a power storage system may be determined as a slight malfunction.

When detecting that a detection value satisfies a first condition, the detection unit 11 makes a notification to that effect to the specifying unit 12. On the other hand, when detecting that a detection value satisfies a second condition, the detection unit 11 outputs a stop instruction to stop an operation of a power storage system. In response to the stop instruction, the power storage system stops the operation (for example, charging and discharging) of the local system.

Figure 4:
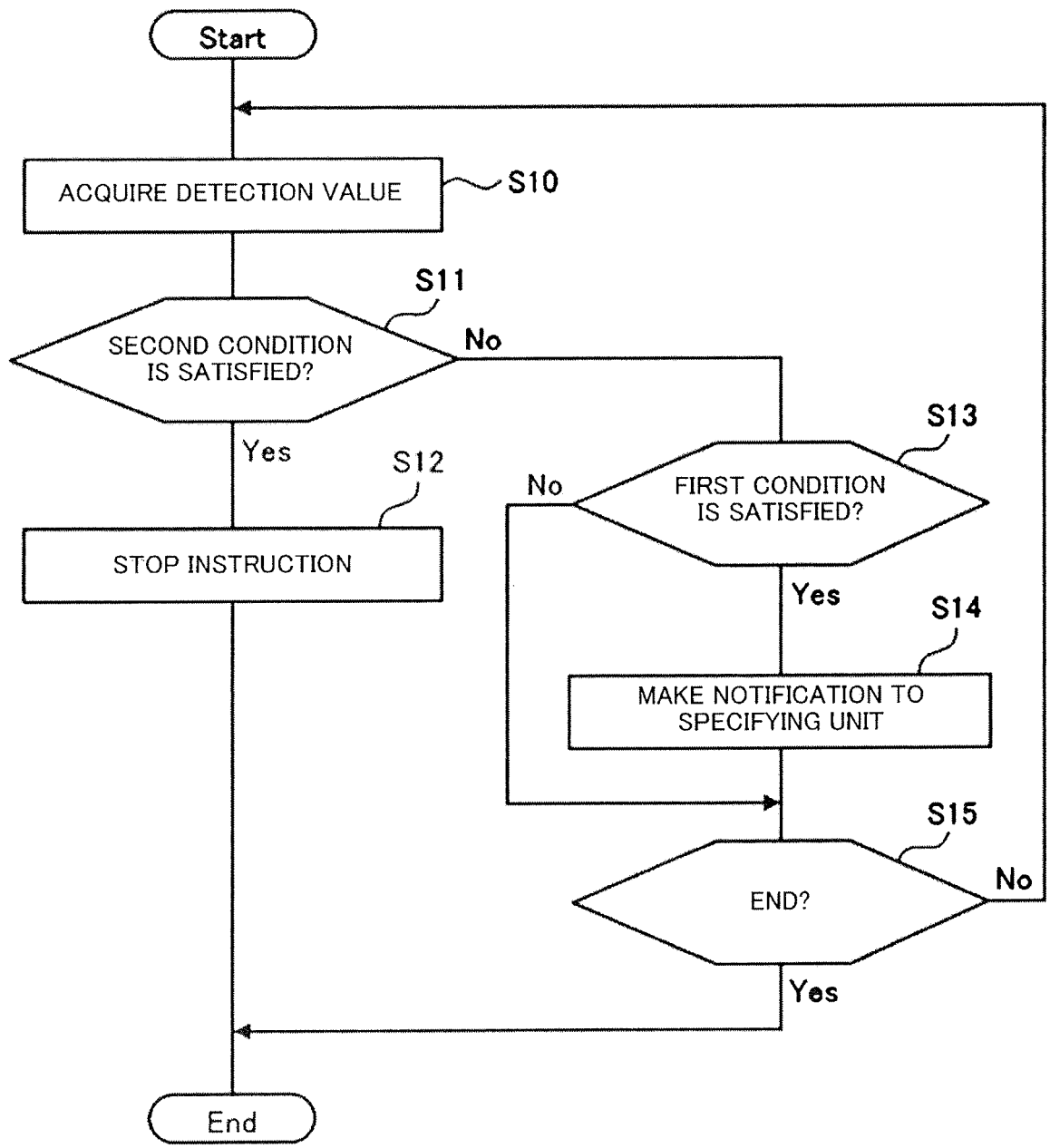
FIG. 4 is a flowchart illustrating an example of a processing flow in a monitoring system according to an example embodiment of the present invention.

An example of a processing flow in the detection unit 11 will be described by use of a flowchart in FIG. 4.

When acquiring a detection value (S10), the detection unit 11 determines whether a predetermined condition is satisfied.

When a second condition is satisfied (Yes in S11), the detection unit 11 outputs a stop instruction to stop an operation of a power storage system (S12). Then, the detection unit 11 ends the processing. For example, when the detection value satisfies a second condition indicating a gas leak from the power storage system, the detection unit 11 outputs a stop instruction to stop the operation of the power storage system. In response to the stop instruction, the power storage system stops the operation (for example, charging and discharging) of the local system.

On the other hand, when a second condition is not satisfied (No in S11), but a first condition is satisfied (Yes in S13), the detection unit 11 makes a notification to that effect to the specifying unit 12 (S14). Then, when a signal for ending the processing does not exist (No in S15), the processing described above is repeated. For example, a first condition such as "an insulation resistance value of a cell stack being less than or equal to a predetermined value" or "a communication retry count being greater than or equal to a predetermined count within a predetermined period of time" is satisfied, the detection unit 11 makes a notification to that effect to the specifying unit 12.

In a case that a second condition is not satisfied (No in S11), and also a first condition is not satisfied (No in S13), when a signal for ending the processing does not exist (No in S15), the detection unit 11 repeats the processing described above.

Returning to FIGS. 2 and 3, the specifying unit 12 specifies a type of malfunction occurring in the power storage system, in response to detection by the detection unit 11. The specifying unit 12 specifies a type of a malfunction occurring in the power storage system, in response to detection of satisfaction of a first condition. When satisfaction of a second condition is detected, the specifying unit 12 does not need to specify a type of a malfunction occurring in the power storage system. For example, the specifying unit 12 may specify ground faults in N locations (where N is an integer greater than or equal to 1), a communication failure, or the like as a malfunction type.

The specifying unit 12 may acquire, from the detection unit 11, information indicating a first condition satisfaction of which is detected. Then, the specifying unit 12 may specify a malfunction type, based on the information. For example, when a first condition "a communication retry count being greater than or equal to a predetermined count within a predetermined period of time" is satisfied, the detection unit 11 may notify information indicating the first condition to the specifying unit 12. Then, the specifying unit 12 may specify a malfunction type "a communication failure," based on the information indicating the first condition.

In addition, the specifying unit 12 may acquire, from the detection unit 11, information indicating a first condition satisfaction of which is detected. Then, the specifying unit 12 may subsequently acquire a detection value related to the first condition and specify a malfunction type, based on the acquired detection value. For example, when a first condition "an insulation resistance value of a cell stack being less than or equal to a predetermined value" is satisfied, the detection unit 11 may notify information indicating the first condition to the specifying unit 12. Then, the specifying unit 12 may subsequently acquire at least either one of a voltage value of each of a plurality of cells included in the cell stack and an execution time of cell balancing. Then, when a cell voltage of at least one cell falls below a reference value, or an execution time of cell balancing in at least one cell exceeds a reference value, the specifying unit 12 may specify a malfunction type "a ground fault." Further, the specifying unit 12 may specify "a number of cells a cell voltage of each of which falls below a reference value" or "a number of cells in each of which an execution time of cell balancing exceeds a reference value" as an occurrence count of ground faults. Relevant processing will be described in detail in the following example. In addition, the specifying unit 12 may specify a cell in which a time (interval time) between cell balancing and subsequent cell balancing is shorter than a reference value as a cell in which a ground fault occurs.

The specifying unit 12 may start monitoring whether or not a detection value satisfies a stop condition, in response to detection (detection of satisfaction of a first condition) by the detection unit 11. Then, when the detection value satisfies a stop condition, the specifying unit 12 may output a stop instruction to stop the operation of the power storage system. In response to the stop instruction, the power storage system stops the operation (for example, charging and discharging) of the local system.

For example, a stop condition is a condition for detecting a severe malfunction that may occur after a first condition is satisfied. For example, when a first condition is "an insulation resistance value of a cell stack being less than or equal to a predetermined value," a stop condition may be "occurrence of ground faults in two or more locations." The stop condition exemplified above is strictly an example and a stop condition is not limited to the above.

Figure 5:
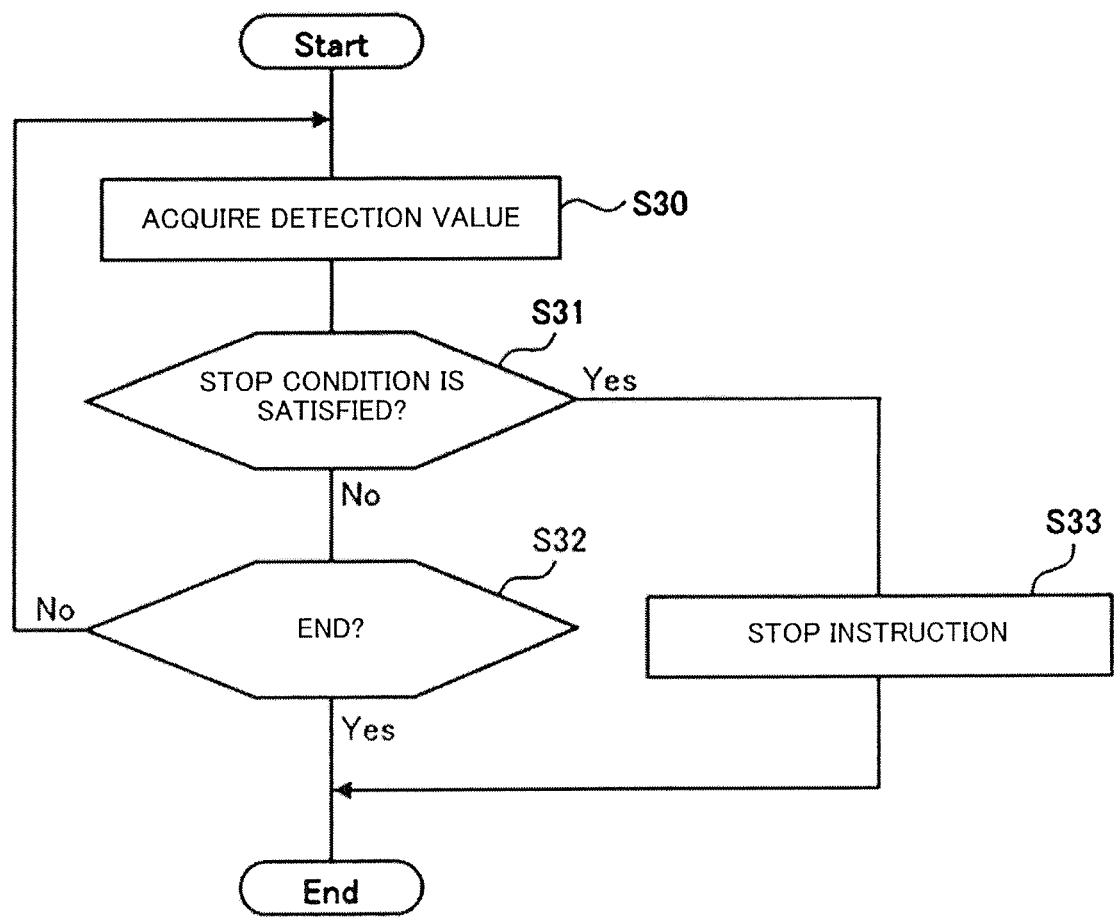
FIG. 5 is a flowchart illustrating an example of a processing flow in a monitoring system according to an example embodiment of the present invention.

An example of a flow of the monitoring processing described above by the specifying unit 12 will be described by use of a flowchart in FIG. 5.

When acquiring a detection value (S30), the specifying unit 12 determines whether a predetermined stop condition is satisfied.

When a stop condition is satisfied (Yes in S31), the specifying unit 12 outputs a stop instruction to stop the operation of the power storage system (S33). Then, the specifying unit 12 ends the processing. In response to the stop instruction, the power storage system stops the operation (for example, charging and discharging) of the local system.

On the other hand, in a case that a stop condition is not satisfied (No in S31), when a signal for ending the processing does not exist (No in S32), the detection unit 11 repeats the processing described above.

Returning to FIGS. 2 and 3, based on a malfunction type specified by the specifying unit 12, the determination unit 13 determines an operation-continuable time of the power storage system after the specification of the malfunction type. As described above, the specifying unit 12 specifies a malfunction type in response to detection of satisfaction of a first condition. Accordingly, the determination unit 13 determines the aforementioned operation-continuable time after the satisfaction of the first condition is detected. For example, the determination unit 13 may determine an operation-continuable time, based on a malfunction type such as "a ground fault in one location" or "a communication failure of the power storage system." When satisfaction of a second condition is detected, the detection unit 11 outputs a stop instruction, as described above. Accordingly, when satisfaction of a second condition is detected, the determination unit 13 does not need to determine the aforementioned operation-continuable time.

Figures 6, 7:
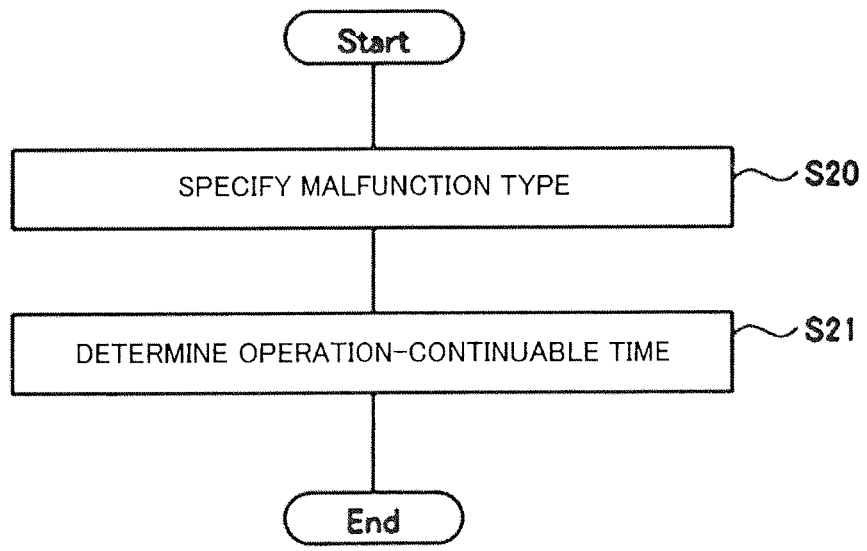
FIG. 6 is a diagram schematically illustrating an example of information handled by a monitoring system according to an example embodiment of the present invention.
FIG. 7 is a flowchart illustrating an example of a processing flow in a monitoring system according to an example embodiment of the present invention.

For example, an operation-continuable time may be predetermined for each of a plurality of malfunction types, as illustrated in FIG. 6. Then, the determination unit 13 may determine an operation-continuable time related to a specified malfunction type as an operation-continuable time of the power storage system after the specification of the malfunction type.

An example of a flow of processing by the specifying unit 12 and the determination unit 13 will be described by use of a flowchart in FIG. 7.

The specifying unit 12 specifies a malfunction type in response to detection of satisfaction of a first condition (S20). Then, in response to the specification of the malfunction type, the determination unit 13 determines an operation-continuable time of the power storage system after the specification of the malfunction type (S21).

Returning to FIGS. 2 and 3, the monitoring unit 14 monitors whether an operation duration time of the power storage system after specification of a malfunction type exceeds an operation-continuable time. Then, when the operation-continuable time is exceeded, the monitoring unit 14 outputs a stop instruction to stop the operation of the power storage system. In response to the stop instruction, the power storage system stops the operation (for example, charging and discharging) of the local system. A measurement start timing of "an operation duration time of the power storage system after specification of a malfunction type" is a matter of design.

The monitoring unit 14 may acquire execution details of maintenance of the power storage system. Execution details of maintenance may include information such as a description of maintenance and an execution date and time. For example, a user (for example, a technician performing maintenance or a user of the power storage system) may input execution details of maintenance through a terminal device such as the power storage system, a smartphone, a mobile phone, a tablet terminal, or a personal computer. The monitoring unit 14 may acquire execution details of maintenance from the aforementioned terminal device. In addition, the monitoring unit 14 may acquire execution details of maintenance from the power storage system.

Then, when predetermined maintenance related to a malfunction is executed after the malfunction type is specified, the monitoring unit 14 may stop monitoring based on an operation-continuable time related to the malfunction type. Further, when predetermined maintenance related to a malfunction is executed after the malfunction type is specified, the specifying unit 12 may stop monitoring whether or not a stop condition related to the malfunction type is satisfied. Predetermined maintenance related to a malfunction type may be predetermined and be held in the monitoring unit 14.

Figure 8:
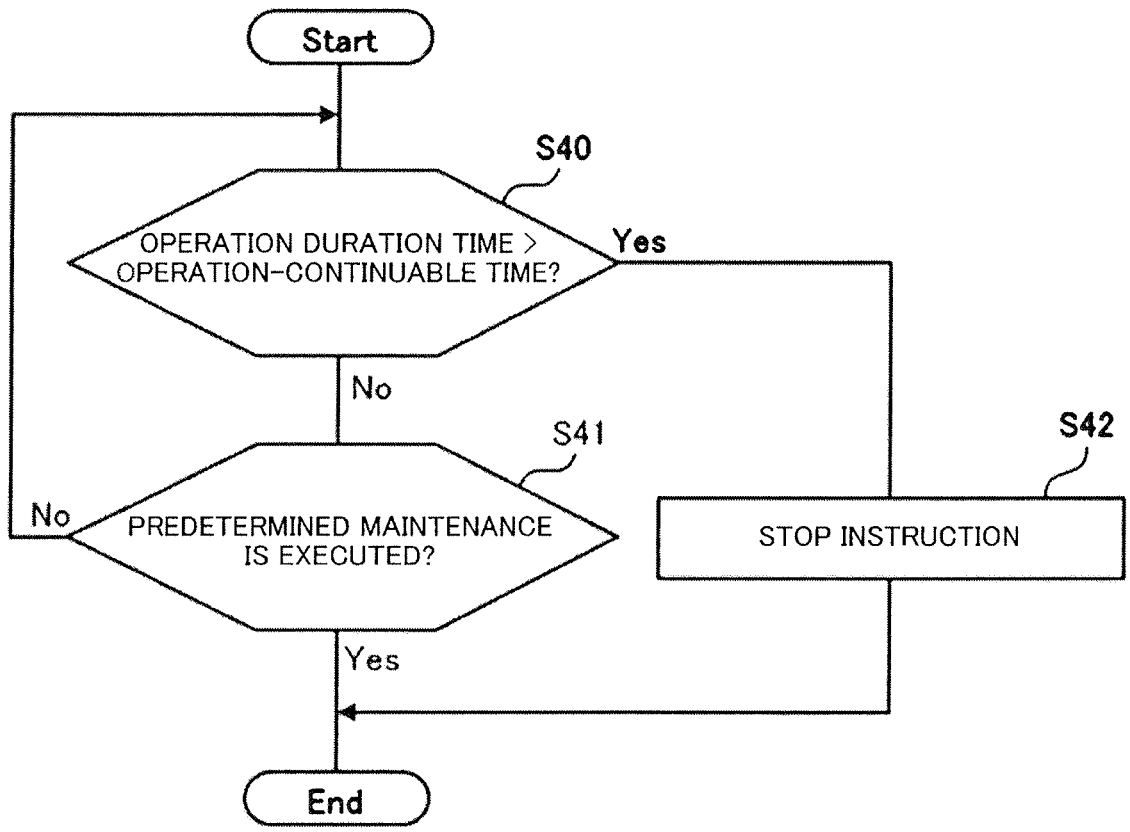
FIG. 8 is a flowchart illustrating an example of a processing flow in a monitoring system according to an example embodiment of the present invention.

An example of a flow of processing by the monitoring unit 14 will be described by use of a flowchart in FIG. 8.

In response to determination of an operation-continuable time, the monitoring unit 14 starts comparison between a subsequent operation duration time of the power storage system and the operation-continuable time. When the operation duration time exceeds the operation-continuable time (Yes in S40), the monitoring unit 14 outputs a stop instruction to stop the operation of the power storage system (S42). In response to the stop instruction, the power storage system stops the operation (for example, charging and discharging) of the local system.

On the other hand, when the operation duration time does not exceed the operation-continuable time (No in S40), and also execution of predetermined maintenance is not confirmed (No in S41), the monitoring unit 14 repeats the processing described above. When execution of predetermined maintenance is confirmed (Yes in S41), the monitoring unit 14 ends the processing.

An application example of the monitoring system 10 according to the present example embodiment will be described. The monitoring system 10 may be configured with one device or may be provided by a plurality of devices physically and/or logically separated from one another.

Figure 9:
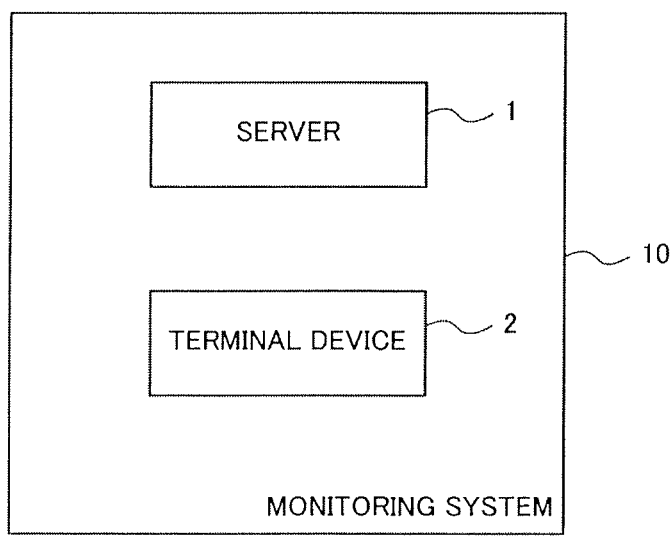
FIG. 9 is a functional block diagram illustrating an application example of a monitoring system according to an example embodiment of the present invention.

For example, the monitoring system 10 may be provided by a server 1 and a terminal device 2, as illustrated in FIG. 9. The server 1 and the terminal device 2 are configured to be mutually communicable by any communication means. In this case, the terminal device 2 may include the detection unit 11, and the server 1 may include the determination unit 13. Then, the server 1 or the terminal device 2 may include the specifying unit 12. Further, the server 1 or the terminal device 2 may include the monitoring unit 14.

In this case, the terminal device 2 may transmit a detection result by the detection unit 11 to the server 1. The terminal device 2 may transmit a detection result of satisfaction of a first condition and a detection result of satisfaction of a second condition to the server 1. The server 1 may store the received information in association with each power storage system.

Figure 10:
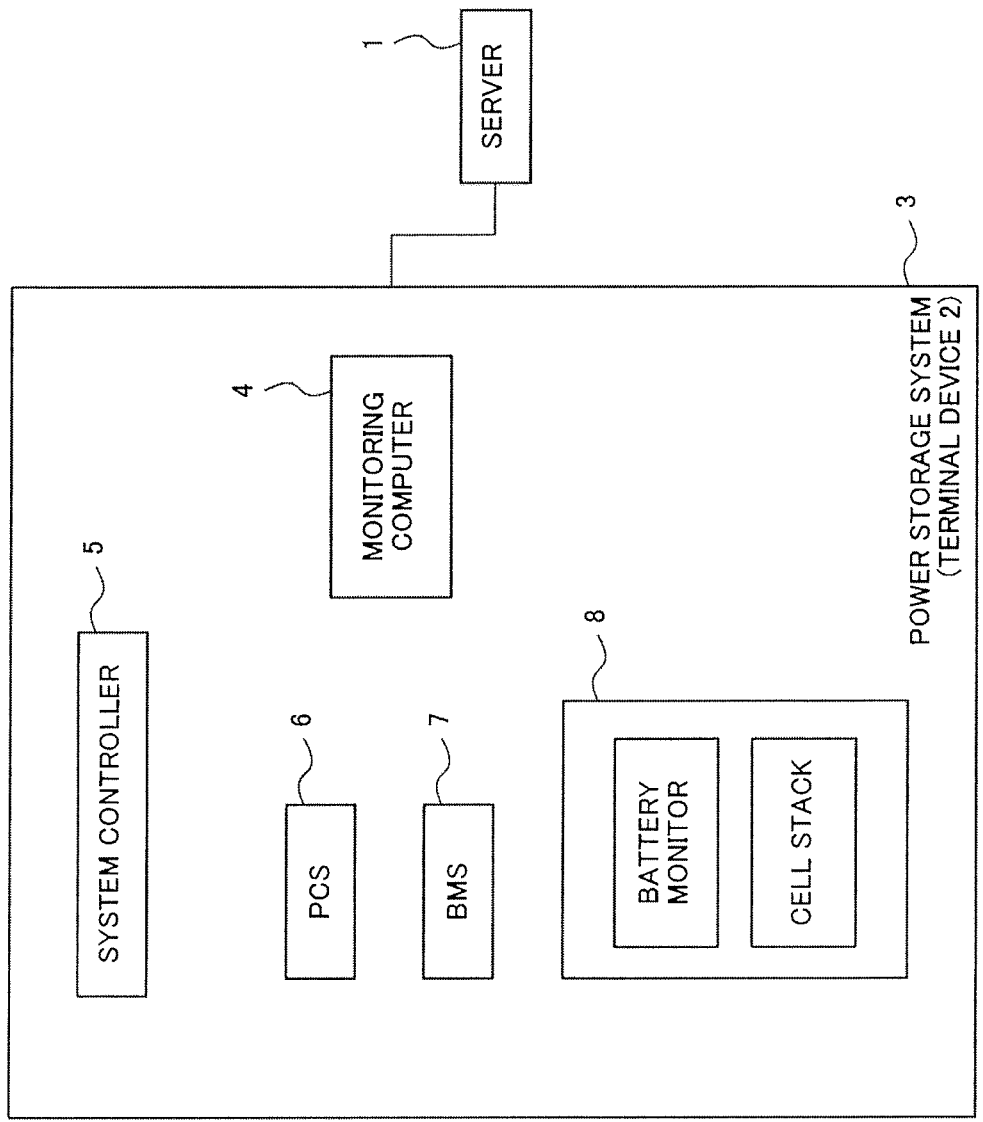
FIG. 10 is a functional block diagram illustrating an application example of a monitoring system according to an example embodiment of the present invention.

FIG. 10 illustrates a configuration example of the monitoring system 10. In the case of the illustrated example, a power storage system 3 also serves as a terminal device 2. The power storage system 3 includes a monitoring computer 4, a system controller 5, a power conditioning system (PCS) 6, a battery management system (BMS) 7, and a battery 8.

The monitoring computer 4 includes the detection unit 11. When the terminal device 2 includes the specifying unit 12, the monitoring computer 4 includes the specifying unit 12. The system controller 5 controls the entire power storage system 3. The PCS 6 performs DC power/AC power conversion. The battery 8 stores electric power. For example, the battery 8 is configured to include a cell stack storing energy and a battery monitor monitoring cell temperature, cell voltage, and the like. The BMS 7 controls the battery 8.

Figure 11:
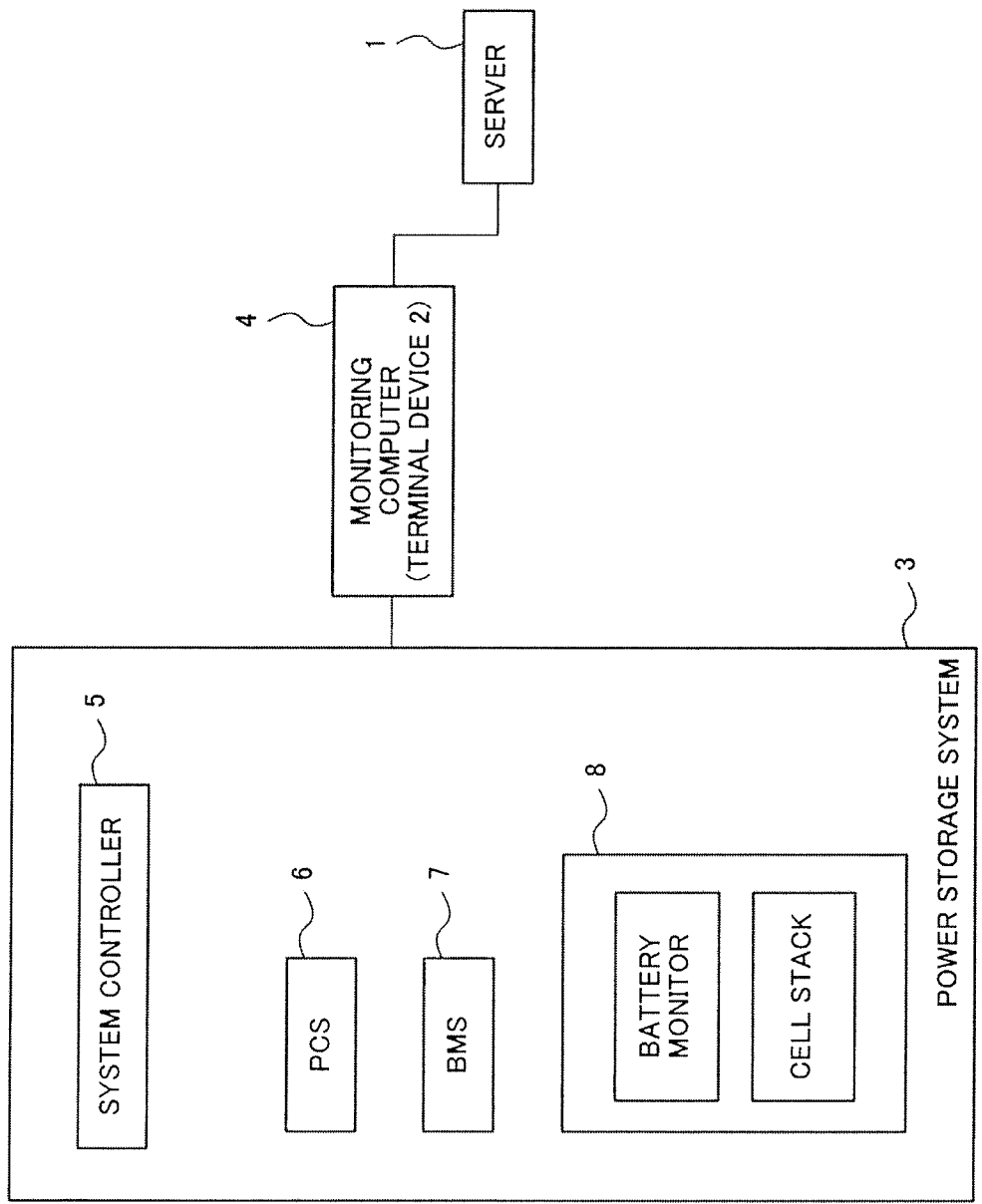
FIG. 11 is a functional block diagram illustrating an application example of a monitoring system according to an example embodiment of the present invention.

FIG. 11 illustrates another configuration example of the monitoring system 10. In the case of the illustrated example, a terminal device 2 physically and/or logically separated from a power storage system 3 is provided. A terminal device 2 is installed correspondingly to a power storage system 3 to be monitored. The terminal device 2 includes the aforementioned monitoring computer 4. Then, the power storage system 3 includes a system controller 5, a PCS 6, a BMS 7, and a battery 8.

As another example, the server 1 or the terminal device 2 may be the monitoring system 10. In other words, the server 1 or the terminal device 2 may include all of the detection unit 11, the specifying unit 12, the determination unit 13, and the monitoring unit 14.

Next, an example will be described. A power storage system includes a plurality of cell stacks connected in parallel with one another. Each cell stack includes a plurality of cells connected in series with one another.

The detection unit 11 periodically acquires an insulation resistance value of each of the plurality of cell stacks at first time intervals. Then, the detection unit 11 detects that the aforementioned insulation resistance value falls below a first reference value (a matter of design) as a first condition. The detection unit 11 may continue comparison between the insulation resistance value and the first reference value after the first condition is detected. In this case, the detection unit 11 may set time intervals at which the insulation resistance value is acquired to intervals shorter than the aforementioned first time intervals, after detecting the first condition.

In response to the detection described above, the specifying unit 12 acquires a voltage value of each of a plurality of cells included in a cell stack falling below the first reference value. Then, when the voltage value falls below a second reference value (a matter of design), the specifying unit 12 specifies that a ground fault occurs. The specifying unit 12 may specify occurrence of ground faults a number of which is a number of cells a voltage value of each of which falls below the second reference value. The second reference value may be predetermined or may be calculated based on voltage values of a plurality of cells.

When a ground fault is not specified (no voltage value of any cell falls below the second reference value), the specifying unit 12 outputs a request for maintenance such as cleaning and inspection. An insulation resistance value may decline due to existence of dust or the like. Accordingly, when an insulation resistance value of a cell stack falls below the first reference value but no voltage value of any cell included in the cell stack falling below the first reference value falls below the second reference value, maintenance such as cleaning and inspection is requested.

When ground faults in two or more locations are specified (when a stop condition is satisfied), the specifying unit 12 outputs a stop instruction to stop the operation of the power storage system. In response to the stop instruction, the power storage system stops the operation (for example, charging and discharging) of the local system.

When a ground fault in one location is specified, the determination unit 13 determines an operation-continuable time related to the malfunction type. Then, the monitoring unit 14 starts monitoring whether an operation duration time of the power storage system after the specification of the malfunction type exceeds the operation-continuable time. In this case, the specifying unit 12 may start monitoring whether or not a detection value satisfies the stop condition (occurrence of ground faults in two or more locations). Then, when the detection value satisfies the stop condition, a stop instruction to stop the operation of the power storage system may be output. In response to the stop instruction, the power storage system stops the operation (for example, charging and discharging) of the local system. Acquisition of a detection value for the monitoring by the specifying unit 12 may be periodically performed at second time intervals. The second time interval may be shorter than the aforementioned first time interval.

While a time period in which a second ground fault is less likely to occur may be determined as an operation-continuable time, a second ground fault may occur during the time period. Even when such a trouble occurs, the power storage system can be stopped and safety can be secured by the monitoring by the specifying unit 12 described above.

As a modified example of the example, the specifying unit 12 may acquire an execution time of cell balancing in each of a plurality of cells included in a cell stack falling below the first reference value, in response to the detection described above. Then, when an execution time of the cell balancing exceeds a third reference value (a matter of design), the specifying unit 12 may specify occurrence of a ground fault. The specifying unit 12 may specify occurrence of ground faults a number of which is a number of cells in which an execution time of cell balancing exceeds the third reference value. The third reference value may be predetermined or may be calculated based on execution times of cell balancing in a plurality of cells.

When a slight malfunction occurs in a power storage system (when a detection value satisfies a first condition), the monitoring system 10 according to the present example embodiment described above can determine a subsequent operation-continuable time, depending on a type of the occurring malfunction. Then, the monitoring system 10 monitors whether a subsequent operation duration time of the power storage system exceeds the operation-continuable time and when the operation-continuable time is exceeded, may stop an operation of the power storage system.

In such a case, the power storage system may continue the operation as-is after occurrence of the slight malfunction, with the operation-continuable time as an upper limit. Consequently, utilization efficiency of the power storage system can be improved.

When the operation-continuable time is exceeded, the operation of the power storage system may be stopped. By suitably setting the operation-continuable time, the operation of the power storage system may be stopped before a severe secondary malfunction due to a slight malfunction is caused after the occurrence of the slight malfunction. Consequently, a sufficient level of safety can be secured.

Furthermore, when a severe malfunction occurs in the power storage system (when a detection value satisfies a second condition), the monitoring system 10 according to the present example embodiment can immediately stop the operation of the power storage system. Consequently, a sufficient level of safety can be secured.

Furthermore, the monitoring system 10 according to the present example embodiment can monitor whether a detection value related to the power storage system satisfies a stop condition during the operation of the power storage system after occurrence of a slight malfunction. Then, when a stop condition is satisfied, the operation of the power storage system may be immediately stopped even when an operation duration time does not exceed an operation-continuable time. Consequently, a sufficient level of safety can be secured.

Furthermore, the monitoring system 10 according to the present example embodiment can acquire information about maintenance of the power storage system and determine whether to continue or stop the monitoring described above (monitoring whether or not an operation-continuable time is exceeded and monitoring whether or not a stop condition is satisfied), depending on the maintenance status. Consequently, a trouble that the operation of the power storage system stops due to an operation duration time exceeding the operation-continuable time in spite of executing maintenance can be avoided. Further, uselessness of continuing the monitoring described above in spite of executing maintenance can be eliminated. Consequently, a load on a computer or the like can be lightened.

Furthermore, the monitoring system 10 according to the present example embodiment can cause the operation of the power storage system to continue when a ground fault in one location occurs in the power storage system, and stop the operation of the power storage system when ground faults in two or more locations occur in the power storage system. In such a case, utilization efficiency of the power storage system can be improved while safety is secured.

Furthermore, the monitoring system 10 according to the present example embodiment can stop the operation of the power storage system before a serious problem occurs in the power storage system, by suitably setting conditions (such as a second condition, a stop condition, and an operation-continuable time) for stopping the operation of the power storage system. Consequently, a trouble of a value of the power storage system declining due to occurrence of a serious problem can be mitigated.

Second Example Embodiment

An overview of a second example embodiment will be described. When a malfunction occurs in a power storage system, a monitoring system 10 according to the present example embodiment specifies a type of the occurring malfunction. Then, the monitoring system 10 can calculate a lifetime of the power storage system, based on the specified malfunction type.

By such a monitoring system 10 according to the present example embodiment, a user can grasp a present value (for example, the value becomes higher as a lifetime becomes longer) of a power storage system, based on a lifetime of a storage battery. In such a case, the user can take a suitable action (for example, maintenance, part replacement, or improvement of a usage direction), based on the grasped value. Consequently, a decline in the value of the power storage system can be suppressed.

For example, a hardware configuration of the monitoring system 10 according to the present example embodiment is similar to the hardware configuration of the monitoring system 10 according to the first example embodiment.

Next, functions of the monitoring system 10 according to the present example embodiment will be described in detail. FIG. 2 illustrates an example of a functional block diagram of the monitoring system 10 according to the present example embodiment. As illustrated, the monitoring system 10 includes a detection unit 11, a specifying unit 12, and a determination unit 13.

FIG. 3 illustrates another example of a functional block diagram of the monitoring system 10 according to the present example embodiment. As illustrated, the monitoring system 10 may include a monitoring unit 14 in addition to the detection unit 11, the specifying unit 12, and the determination unit 13.

The detection unit 11 detects that a detection value related to the power storage system satisfies a condition. The detection processing is similar to the detection processing by the detection unit 11 according to the first example embodiment.

The detection unit 11 notifies a detection result (a detection result of satisfaction of a first condition or a second condition, according to the present example embodiment) to the specifying unit 12. A detection result may include a detection timing (for example, a detection date and time), a detection content (for example, a satisfied condition), and a detection value. According to the present example embodiment, the detection unit 11 may notify a detection result to the specifying unit 12 every time detection is performed, or may collectively notify, at every predetermined time, detection results acquired during the predetermined time to the specifying unit 12.

The detection unit 11 may have the functions described in the first example embodiment.

The specifying unit 12 specifies a type of malfunction occurring in the power storage system, the malfunction satisfying the aforementioned condition. A specifying method of a malfunction type is similar to that according to the first example embodiment. The specifying unit 12 according to the present example embodiment also specifies a type of a malfunction occurring in the power storage system when a second condition is satisfied. A specifying method of a malfunction type when a second condition is satisfied may be provided similarly to the specifying method of a malfunction type when a first condition is satisfied.

The specifying unit 12 may have the functions described in the first example embodiment.

The determination unit 13 calculates a lifetime (remaining lifetime) of the power storage system, based on a malfunction type specified by the specifying unit 12. The determination unit 13 may calculate the aforementioned lifetime based on a duration time of each type of malfunction. "A duration time of each type of malfunction" is a time period in which the malfunction is continuously occurring in the power storage system. For example, even after a detection value satisfies a condition, the detection unit 11 may continue determination of whether or not the detection value satisfies the condition, at every predetermined time. Further, even after specifying a malfunction type, the specifying unit 12 may continue determination of whether or not a condition specifying the malfunction type is satisfied, at every predetermined time. Based on the result, a duration time of a predetermined malfunction may be specified.

A calculation method of a lifetime is a matter of design. For example, the determination unit 13 may previously hold information indicating a standard remaining lifetime based on a period of use. Further, the determination unit 13 may grasp a period of use of the power storage system by any method (for example, user input, or previously receiving input of a start year and month of use at a start of service and performing calculation by use of an elapsed time from the start timing of use and the information) and specify a remaining lifetime based on the grasped period of use. Then, the determination unit 13 may calculate a remaining lifetime by subtracting, from the specified standard remaining lifetime, a correction value calculated based on a type and a duration time of a malfunction specified by the specifying unit 12, and the like. For example, a greater correction value may be calculated for a malfunction type having a greater effect on a lifetime decline. Further, a greater correction value may be calculated for each type of malfunction with a longer duration time.

The determination unit 13 may have the functions described in the first example embodiment.

Functions of the monitoring unit 14 are similar to those according to the first example embodiment.

The monitoring system 10 may notify a remaining lifetime of the power storage system, in response to a request from another user. Further, when a calculated remaining lifetime deviates from a standard remaining lifetime in a period of use at a predetermined level or more, the monitoring system 10 may make a notification to a predetermined user by email or the like, or may cause the power storage system to output a warning.

Application examples of the monitoring system 10 according to the present example embodiment are similar to the application examples according to the first example embodiment described by use of FIGS. 9 to 11.

The monitoring system 10 according to the present example embodiment described above can calculate a remaining lifetime of a power storage system, based on a malfunction occurring in the power storage system. Based on the remaining lifetime, a value of the monitoring system 10 at that point in time can be grasped.

In such a case, a user can take a suitable action (for example, maintenance, part replacement, or improvement of a usage direction), based on the grasped value. Consequently, a decline in a value of the power storage system can be suppressed.

Furthermore, when a calculated remaining lifetime deviates from a standard remaining lifetime in a period of use at a predetermined level or more, the monitoring system 10 according to the present example embodiment can make a notification to a predetermined user by email or the like, or cause the power storage system to output a warning.

In such a case, based on the notification content, the user can grasp that a value of the power storage system falls below a standard. Then, the user can promptly take a suitable action (for example, maintenance, part replacement, or improvement of a usage direction), based on the grasped value. Consequently, a decline in the value of the power storage system can be suppressed, compared with a case that the state is maintained.

Third Example Embodiment

An overview of a third example embodiment will be described. When detecting that a power storage system executes a predetermined prohibited action, a monitoring system 10 according to the present example embodiment specifies a type of the detected prohibited action. Then, based on the specified prohibited action type, the monitoring system 10 can calculate a lifetime of the power storage system. For example, a matter that may cause a decrease in a lifetime of the power storage system may be predetermined as a prohibited action.

By such a monitoring system 10 according to the present example embodiment, a user can grasp a present value (for example, a longer lifetime represents a higher value) of the power storage system, based on a lifetime of a storage battery. In such a case, the user can take a suitable action (for example, maintenance, part replacement, or improvement of a usage direction), based on the grasped value. Consequently, a decline in the value of the power storage system can be suppressed.

For example, a hardware configuration of the monitoring system 10 according to the present example embodiment is similar to the hardware configuration of the monitoring system 10 according to the first and second example embodiments.

Next, functions of the monitoring system 10 according to the present example embodiment will be described in detail. FIG. 2 illustrates an example of a functional block diagram of the monitoring system 10 according to the present example embodiment. As illustrated, the monitoring system 10 includes a detection unit 11, a specifying unit 12, and a determination unit 13.

The detection unit 11 detects that a detection value related to a power storage system satisfies a condition. A detection value is a value for detecting that the power storage system executes a predetermined prohibited action. The detection unit 11 may acquire a detection value from the power storage system, a sensor installed in the power storage system, or the like.

For example, a prohibited action is an action that may cause a decrease in a lifetime of the power storage system. While the following actions (1) to (11) are exemplified as examples of prohibited actions, prohibited actions are not limited to the following. For example, the detection unit 11 detects at least one of the following actions (1) to (11).

(1) Use of a power storage system for a purpose other than a predetermined purpose.
(2) Unauthorized alteration of a power storage system.
(3) Obstruction of a vent hole provided in a power storage system.
(4) At least either one of a cumulative value of charged energy and a cumulative value of discharged energy in a predetermined period exceeding a predetermined upper limit.
(5) A state of charge (SOC) of a power storage system exceeding a predetermined upper limit.
(6) An SOC of a power storage system falling below a predetermined lower limit.
(7) The temperature of a power storage system or the temperature of a room in which the power storage system is installed exceeding a predetermined upper limit.
(8) Stopping an air conditioner installed in a room in which a power storage system is installed.
(9) Moving an installation position of a power storage system from a set position.
(10) Lack of maintenance of a power storage system.
(11) A reset operation being performed a predetermined number of times or more.

Details of the prohibited actions (1) to (11) and an example of detection processing of execution of the prohibited actions will be described below.

"(1) Use of a Power Storage System for a Purpose Other than a Predetermined Purpose"

An administrator of a power storage system can gain diverse benefits by using the power storage system for various purposes. For example, an electricity bill to be paid to an electric power company can be held down by performing charging during the nighttime when an electricity rate is relatively low, and performing discharging during the daytime when an electricity rate is relatively high (hereinafter referred to as "nighttime charging and daytime discharging"). The nighttime charging and daytime discharging is hereinafter referred to as a "first purpose." In addition, the administrator of the power storage system can receive an incentive by participating in a service provided by an electric-power related operator (for example, an ancillary service) and letting the power storage system be used. When participating in the service, the administrator lets charging and discharging be performed from the power storage system for supply-demand balance adjustment of an electric power system, lets charging and discharging be performed from the power storage system when a retail electricity business has difficulty in achieving 30-minute balancing by adjusting the local system, and lets the power storage system be charged in response to a request from a power generation operator owning a power generation device using natural energy (for example, sunlight), or the like (for example, in a case of receiving output control from an electric power transmission and distribution operator). Participation in a service provided by an electric-power related operator is herein referred to as a "second purpose." In addition, when an administrator of a power storage system holds a power generation device using natural energy (for example, sunlight), an example of charging the power storage system with surplus power (electric power not consumed by a load) generated by the power generation device during the daytime may be considered. Charging with surplus power in the power generation device is hereinafter referred to as a "third purpose."

However, when a power storage system is used for various purposes, charging and discharging may be repeated many times in a short period of time. Consequently, a rate of decrease of a lifetime of the power storage system may be accelerated. Accordingly, it is assumed that interested parties who are inclined to suppress a decline in a value of the power storage system, such as a leasing company leasing the power storage system and a financial institution leasing money with the power storage system as security want use for only a predetermined purpose. Then, for example, use of the power storage system for a purpose other than the predetermined purpose may be determined as a prohibited action.

The detection unit 11 can detect use for an unintended purpose by various techniques. For example, the detection unit 11 may detect use of a power storage system for an unintended purpose, based on a pattern of changes in charging and discharging of the power storage system over time in a predetermined period of time (for example, one day). It is assumed that a characteristic part appears in the aforementioned pattern for each use purpose. For example, in the case of nighttime charging and daytime discharging, the power storage system performs charging during the nighttime and discharging during the daytime. Consequently, charging does not appear during the daytime, and discharging does not appear during the nighttime. The detection unit 11 may detect use for an unintended purpose by checking whether a characteristic appearing in a case of use for an unintended purpose exists in the aforementioned pattern of the power storage system.

For example, use for the first purpose and use for the second and third purposes may be distinguished based on "existence or nonexistence of daytime charging." In the case of use for the first purpose, charging is not performed during the daytime. On the other hand in the case of use for the second and third purposes, charging is performed during the daytime. Use for the second purpose and use for the third purpose may be distinguished based on "a mode of charging and discharging." In the case of use for the second purpose, a repetition frequency of charging and discharging increases, a cycle of charging and discharging becomes shorter, increase and decrease of output on the charging side is repeated in shorter cycles, and increase and decrease of output on the discharging side is repeated in shorter cycles, compared with use for the third purpose. By use of the characteristics, use for the second purpose and use for the third purpose may be distinguished.

"(2) Unauthorized Alteration of a Power Storage System"

When a power storage system is altered in an unauthorized manner, a rate of decrease of a lifetime of the power storage system may be accelerated due to use of an inexpensive part, unskillful processing, or the like. Accordingly, in order to hold down a decline in a value of the power storage system, unauthorized alteration of the power storage system may be determined as a prohibited action.

The detection unit 11 can detect unauthorized alteration by various techniques. For example, the detection unit 11 may detect unauthorized alteration, based on changes in a cumulative value of discharge electric power of the power storage system over time. A trend in changes in the aforementioned cumulative value over time may change due to occurrence of a malfunction caused by replacement with an inexpensive part or unskillful processing originating from unauthorized alteration, or the like. Specifically, a rate of increase of the cumulative value declines. The detection unit 11 may detect unauthorized alteration by detecting a change in the trend (for example, a rate of increase of a cumulative value) at a predetermined level or more.

In addition, the detection unit 11 may detect unauthorized alteration, based on changes in a state of health (SOH) of the power storage system over time. A trend in changes in the aforementioned SOH over time may change due to unauthorized alteration. Specifically, a rate of SOH decrease increases. The detection unit 11 may detect unauthorized alteration by detecting a change in the trend (for example, a rate of decrease) at a predetermined level or more.

In addition, the detection unit 11 may detect unauthorized alteration, based on changes in temperature of the power storage system over time. The temperature of the power storage system is likely to rise due to unauthorized alteration. In other words, a rate of temperature increase increases due to unauthorized alteration. The detection unit 11 may detect unauthorized alteration by detecting a change in the trend (for example, a rate of temperature increase) at a predetermined level or more.

"(3) Obstruction of a Vent Hole Provided in a Power Storage System"

Obstruction of a vent hole provided in a power storage system causes an internal temperature rise, and a rate of decrease of a lifetime of the power storage system may be accelerated. Accordingly, in order to hold down a decline in a value of the power storage system, the obstruction of a vent hole may be determined as a prohibited action.

The detection unit 11 can detect obstruction of a vent hole provided in the power storage system by various techniques. For example, the detection unit 11 may detect obstruction of a vent hole, based on pressure in a closed space including the vent hole. It is assumed that obstruction of the vent hole causes a rise in the pressure in the space. The detection unit 11 may detect obstruction of the vent hole by detecting that the pressure in the space exceeds a reference value.

In addition, the detection unit 11 may detect obstruction of a vent hole, based on temperature in a closed space including the vent hole. It is assumed that obstruction of the vent hole causes a temperature rise in the space. The detection unit 11 may detect obstruction of the vent hole by detecting that the temperature in the space exceeds a reference value.

"(4) at Least Either One of a Cumulative Value of Charged Energy and a Cumulative Value of Discharged Energy in a Predetermined Period Exceeding a Predetermined Upper Limit"

When charging and discharging is frequently repeated in a short period of time, a rate of decrease of a lifetime of a power storage system may be accelerated. Accordingly, in order to hold down a decline in a value of the power storage system, at least either one of a cumulative value of charged energy and a cumulative value of discharged energy in a predetermined period exceeding a predetermined upper limit may be determined as a prohibited action.

The detection unit 11 can detect the prohibited action by comparing at least either one of a cumulative value of charged energy (an actually measured value) and a cumulative value of discharged energy (an actually measured value) in a predetermined period (a matter of design) with a predetermined upper limit.

"(5) an SOC of a Power Storage System Exceeding a Predetermined Upper Limit and (6) an SOC of a Power Storage System Falling Below a Predetermined Lower Limit"

Overcharging or overdischarging may accelerate a rate of decrease of a lifetime of a power storage system. Accordingly, in order to hold down a decline in a value of the power storage system, use deviating from a range determined by at least either one of an upper limit and a lower limit of an SOC may be determined as a prohibited action.

The detection unit 11 can detect the prohibited action by comparing an SOC (an actually measured value) with an upper limit and/or a lower limit.

"(7) the Temperature of a Power Storage System or the Temperature of a Room in which the Power Storage System is Installed Exceeding a Predetermined Upper Limit"

Use under high temperature may accelerate a rate of decrease of a lifetime of a power storage system. Further, use with the temperature of the power storage system exceeding a predetermined upper limit may accelerate the rate of decrease of the lifetime of the power storage system. Accordingly, in order to hold down a decline in a value of the power storage system, the temperature of the power storage system or the temperature of a room in which the power storage system is installed exceeding the predetermined upper limit may be determined as a prohibited action.

The detection unit 11 can detect the prohibited action by comparing the room temperature and the temperature of the power storage system with the upper limit.

"(8) Stopping an Air Conditioner Installed in a Room in which a Power Storage System is Installed"

When an air conditioner installed in a room in which a power storage system is installed stops, the temperature of the room may rise. Use under such an environment may accelerate a rate of decrease of a lifetime of the power storage system. Accordingly, in order to hold down a decline in a value of the power storage system, stoppage of the air conditioner may be determined as a prohibited action.

The detection unit 11 can detect stoppage of the air conditioner by various techniques. For example, the detection unit 11 may acquire information indicating a state (active or inactive) from a controller of the air conditioner. Then, the detection unit 11 may detect stoppage of the air conditioner, based on the information.

The prohibited action (stoppage of the air conditioner) may be conditional. Specifically, when stopping the air conditioner does not cause a problem, the prohibited action may not be applied. For example, the prohibited action may be applied only when conditions such as "the outdoor temperature being greater than or equal to a predetermined value" or "a predetermined period (a higher-temperature period) in a year" is satisfied. In such a case, the detection unit 11 performs detection of the prohibited action only when the condition is satisfied.

"(9) Moving an Installation Position of a Power Storage System from a Set Position"

Use of a power storage system installed under a severe environment such as under a blazing sky or under high temperature may accelerate a rate of decrease of a lifetime of the power storage system. Accordingly, in order to hold down a decline in a value of the power storage system, moving the power storage system may be determined as a prohibited action.

The detection unit 11 can detect movement of the power storage system by various techniques. For example, the detection unit 11 may detect movement of the power storage system by detecting that a measured value of a vibration sensor installed in the power storage system exceeds a predetermined value. In addition, the power storage system may be provided with a positional information acquisition means such as the Global Positioning System (GPS) and periodically transmit positional information of the local system to the monitoring system 10. Then, based on the positional information, the detection unit 11 may detect movement of the power storage system. In addition, a camera capturing an image of a set installation position of the power storage system may transmit the image data to the monitoring system 10. Then, the detection unit 11 may detect movement of the power storage system by analyzing the image.

"(10) Lack of Maintenance of a Power Storage System"

A decline in a lifetime of a power storage system may be suppressed by periodic maintenance. Maintenance may be automatically performed by a computer or may be performed by a technician. Even when maintenance is performed by a computer, for example, use of the power storage system may be given priority (an operation of the power storage system needs to be stopped during maintenance) and an administrator of the power storage system may perform an operation of delaying execution of maintenance, or the like. For example, while filter cleaning, replenishment of cooling water, refresh charging, and part replacement are exemplified as maintenance, maintenance is not limited to the above. Accordingly, in order to hold down a decline in a value of the power storage system, lack of maintenance may be determined as a prohibited action.

The detection unit 11 can detect lack of maintenance by various techniques. For example, the detection unit 11 may acquire information indicating execution details of maintenance from the power storage system. The power storage system may acquire execution details of maintenance, based on information collected by a sensor installed in the power storage system. In addition, the detection unit 11 may acquire execution details of maintenance input by a user (for example, a technician performing maintenance or a user of the power storage system) from a terminal device of the user. Then, based on the information, the detection unit 11 may detect that maintenance is not performed by a predetermined time limit (lack of maintenance).

"(11) a Reset Operation being Performed a Predetermined Number of Times or More"

A power storage system capable of determining the prohibited action is configured to stop an operation in response to a predetermined event. A predetermined event is any event by which a rate of decrease of a lifetime of the power storage system may be accelerated. Then, the power storage system is configured to cancel the stoppage in response to a reset operation after the stoppage and move to a ready state again.

When the operation stops in response to a predetermined event, execution of maintenance such as cleaning and inspection is needed. However, use of the power storage system may be given priority, a reset operation may be performed without performing maintenance, and the power storage system may be used as-is. In such a case, a serious problem may be subsequently caused in the power storage system. Consequently, a rate of decrease of a lifetime of the power storage system may be accelerated. Accordingly, in order to hold down a decline in a value of the power storage system, a reset operation being performed a predetermined number of times or more may be determined as a prohibited action. A detected reset operation count may be a cumulative count from a starting point of use of the power storage system or may be a cumulative count in a latest predetermined period.

The detection unit 11 may acquire information about a reset operation from the power storage system and detect the reset operation being performed a predetermined number of times or more, based on the information.

The detection unit 11 may have the functions described in the first and second example embodiments.

The specifying unit 12 specifies a type of a prohibited action executed in the power storage system. The specifying unit 12 can specify a type of a prohibited action executed in the power storage system, based on a detection result (a condition satisfied by a detection value) by the detection unit 11. The specifying unit 12 may have the functions described in the first and second example embodiments.

The determination unit 13 calculates a lifetime (remaining lifetime) of the power storage system, based on a prohibited action type specified by the specifying unit 12. The determination unit 13 may calculate the lifetime, based on a duration time of each prohibited action type.

"A duration time of each prohibited action type" is a time period in which execution of the prohibited action is continued. For example, a cumulative time of use of the power storage system for an unintended purpose, a cumulative time in which a state of a vent hole being obstructed is maintained, a cumulative time in which a state of an SOC exceeding an upper limit is maintained, a cumulative time in which a state of an SOC falling below a lower limit is maintained, a cumulative time in which a state of the temperature of the power storage system or the temperature of a room in which the power storage system is installed exceeding a predetermined upper limit is maintained, a cumulative time in which a state of an air conditioner installed in a room in which the power storage system is installed being stopped is maintained, a cumulative time in which a state of the power storage system being moved from a predetermined position is maintained, and a cumulative time in which lack of maintenance (a state of maintenance not being performed by a predetermined time limit) of the power storage system is maintained are exemplified. Measurement of such duration times may be provided by any means.

A calculation method of a lifetime is a matter of design. For example, the determination unit 13 may previously hold information indicating a standard remaining lifetime based on a period of use. Further, the determination unit 13 may grasp a period of use of the power storage system by any method (for example, user input, or previously receiving input of a start year and month of use at the start of service and performing calculation by use of an elapsed time from the start timing of use and the information) and specify a remaining lifetime based on the grasped period of use. Then, the determination unit 13 may calculate a remaining lifetime by subtracting, from the specified standard remaining lifetime, a correction value calculated based on a prohibited action type specified by the specifying unit 12, a duration time of the prohibited action, and the like. For example, a greater correction value may be calculated for a prohibited action type having a greater effect on a lifetime decline. Further, a greater correction value may be calculated for a prohibited action type with a longer duration time.

The determination unit 13 may have the functions described in the first and second example embodiment.

The monitoring system 10 may notify a remaining lifetime of the power storage system in response to a request from another user. Further, when a calculated remaining lifetime deviates from a standard remaining lifetime in a period of use at a predetermined level or more, the monitoring system 10 may make a notification to a predetermined user by email or the like, or cause the power storage system to output a warning.

Application examples of the monitoring system 10 according to the present example embodiment are similar to the application examples according to the first example embodiment described by use of FIGS. 9 to 11.

The monitoring system 10 according to the present example embodiment described above can calculate a remaining lifetime of a power storage system, based on a prohibited action executed in the power storage system. A value of the monitoring system 10 at that point in time can be grasped based on the remaining lifetime.

In such a case, a user can take a suitable action (for example, maintenance, part replacement, or improvement of a usage direction), based on the grasped value. Consequently, a decline in the value of the power storage system can be suppressed.

Furthermore, when a calculated remaining lifetime deviates from a standard remaining lifetime in a period of use at a predetermined level or more, the monitoring system 10 according to the present example embodiment can make a notification to a predetermined user by email or the like, or cause the power storage system to output a warning.

In such a case, based on the notification content, the user can grasp that a value of the power storage system falls below a standard. Then, the user can promptly take a suitable action (for example, maintenance, part replacement, or improvement of a usage direction), based on the grasped value. Consequently, a decline in the value of the power storage system can be suppressed, compared with a case that the state is maintained.

Fourth Example Embodiment

An overview of a fourth example embodiment will be described. When detecting that a prohibited action predetermined in relation to a power storage system is executed, a monitoring system according to the present example embodiment determines a subsequent operation-continuable time, depending on a type of the executed prohibited action. In such a case, the power storage system may continue an operation as-is, even after the prohibited action is executed. Then, when an operation duration time exceeds the operation-continuable time, the monitoring system may stop the operation of the power storage system.

Considering a benefit of a user of the power storage system, it is undesirable to suddenly stop an operation of the power storage system in response to detection of a prohibited action. However, when the power storage system is left to stand in spite of the prohibited action being performed, a value of the power storage system may significantly decline. Consequently, a leasing company leasing the power storage system, a financial institution leasing money with the power storage system as security, and the like may suffer a disadvantage.

According to the present example embodiment, an operation of a power storage system may be stopped at a suitable timing while considering a balance between a user of the power storage system and an interested party who dislikes a decline in a value of the power storage system. Consequently, a trouble that the value of the power storage system declines can be suppressed while maintaining convenience of the user of the power storage system.

For example, a hardware configuration of a monitoring system 10 according to the present example embodiment is similar to the hardware configuration of the monitoring system 10 according to the first to third example embodiments.

Next, functions of the monitoring system 10 according to the present example embodiment will be described in detail. FIG. 2 illustrates an example of a functional block diagram of the monitoring system 10 according to the present example embodiment. As illustrated, the monitoring system 10 includes a detection unit 11, a specifying unit 12, and a determination unit 13.

FIG. 3 illustrates another example of a functional block diagram of the monitoring system 10 according to the present example embodiment. As illustrated, the monitoring system 10 may include a monitoring unit 14 in addition to the detection unit 11, the specifying unit 12, and the determination unit 13.

Functions of the detection unit 11 are similar to those according to the third example embodiment. The detection unit 11 may have the functions according to the first and second example embodiments.

Functions of the specifying unit 12 are similar to those according to the third example embodiment. The specifying unit 12 may have the functions according to the first and second example embodiments.

Based on a prohibited action type specified by the specifying unit 12, the determination unit 13 determines an operation-continuable time of the power storage system after the specification. For example, an operation-continuable time may be predetermined for each of a plurality of prohibited action types, as illustrated in FIG. 12. Then, the determination unit 13 may determine an operation-continuable time related to a specified prohibited action type as an operation-continuable time of the power storage system after specification of the prohibited action. Prohibited action types may include a type with an operation-continuable time being "0." When an operation-continuable time being "0" is determined, the monitoring system 10 outputs a stop instruction to stop an operation of the power storage system, in response to the determination. In response to the stop instruction, the power storage system stops the operation (for example, charging and discharging) of the local system.

The determination unit 13 may have the functions according to the first to third example embodiments.

The monitoring unit 14 monitors whether an operation duration time of the power storage system after specification of a prohibited action type exceeds an operation-continuable time and when the operation-continuable time is exceeded, outputs a stop instruction to stop an operation of the power storage system. In response to the stop instruction, the power storage system stops the operation (for example, charging and discharging) of the local system. A measurement start timing of "an operation duration time of the power storage system after specification of a prohibited action type" is a matter of design.

The monitoring unit 14 may have the functions according to the first and second example embodiments.

Application examples of the monitoring system 10 according to the present example embodiment are similar to the application examples according to the first example embodiment described by use of FIGS. 9 to 11.

The monitoring system 10 according to the present example embodiment described above can stop an operation of a power storage system after an elapse of a certain period of time (operation-continuable time) instead of suddenly stopping the operation in response to detection of a prohibited action. By suitably setting the operation-continuable time, a good balance between benefits of both parties being a user of the power storage system and an interested party who dislikes a decline in a value of the power storage system can be kept.

Furthermore, according to the present example embodiment, an operation-continuable time related to a certain prohibited action type can be set to "0." By setting an operation-continuable time to "0," an operation of a power storage system can be stopped immediately after detection. By taking such an action against a prohibited action significantly reducing a value of the power storage system, a benefit of an interested party who dislikes a decline in the value of the power storage system can be sufficiently secured.

Fifth Example Embodiment

A monitoring system 10 according to a fifth example embodiment has at least two of the functions according to the first to fourth example embodiments. The monitoring system 10 according to the present example embodiment can provide operations and effects similar to those provided by the first to fourth example embodiments.

Examples of a reference example embodiment are added below as Supplementary Notes. The aforementioned example embodiments may also be described in part or in whole as the following Supplementary Notes but are not limited thereto.

(Supplementary note 1) A monitoring system comprising:

detection means for detecting that a detection value related to a power storage system satisfies a condition;

specifying means for specifying a type of a prohibited action executed in the power storage system satisfying the condition; and determination means for, based on a specified prohibited action type, performing at least either of calculation of a lifetime of the power storage system and determination of an operation-continuable time of the power storage system after specification.

(Supplementary note 2) The monitoring system according to supplementary note 1, wherein the specifying means further specifies a type of a malfunction occurring in the power storage system satisfying the condition, and the determination means calculates a lifetime of the power storage system, based on a duration time of at least either one of each type of specified prohibited action and each type of malfunction.

(Supplementary note 3) The monitoring system according to supplementary note 1 or 2, further comprising monitoring means for monitoring whether an operation duration time of the power storage system after specification of a prohibited action type exceeds the operation-continuable time, and when the operation-continuable time is exceeded, outputting a stop instruction for stopping an operation of the power storage system.

(Supplementary note 4) The monitoring system according to any one of supplementary notes 1 to 3, wherein the power storage system stops in response to detection of a predetermined event and cancels a stoppage in response to a reset operation after the stoppage, and the specifying means specifies the reset operation performed a predetermined number of times or more, as a prohibited action.

(Supplementary note 5) The monitoring system according to any one of supplementary notes 1 to 4, wherein the specifying means specifies, as a prohibited action, at least one action out of:

use of the power storage system for a purpose other than a predetermined purpose;

unauthorized alteration of the power storage system;

obstruction of a vent hole provided in the power storage system;

at least either one of a cumulative value of charged energy and a cumulative value of discharged energy in a predetermined period exceeding a predetermined upper limit;

a state of charge (SOC) of the power storage system exceeding a predetermined upper limit;

an SOC of the power storage system falling below a predetermined lower limit;

a temperature of the power storage system or a temperature of a room in which the power storage system is installed exceeding a predetermined upper limit;

stopping an air conditioner installed in a room in which the power storage system is installed;

moving an installation position of the power storage system from a set position; and lack of maintenance of the power storage system.

(Supplementary note 6) The monitoring system according to supplementary note 2, wherein the specifying means specifies that a ground fault occurs in the power storage system.

(Supplementary note 7) The monitoring system according to supplementary note 6, wherein the power storage system includes a plurality of cell stacks connected in parallel with one another, the detection means detects that an insulation resistance value of each of the plurality of cell stacks falls below a first reference value, and, when an insulation resistance value of the cell stack falls below the first reference value, the specifying means acquires a voltage value of each of a plurality of cells included in the cell stack falling below the first reference value, and when the voltage value falls below a second reference value, specifies that a ground fault occurs.

(Supplementary note 8) The monitoring system according to Supplementary note 7, wherein, when an insulation resistance value of the cell stack falls below the first reference value, the specifying means acquires a voltage value of each of a plurality of cells included in the cell stack falling below the first reference value, and specifies that one or more ground faults a number of which is a number of one or more of the cells the voltage value of each of which falls below the second reference value occur.

(Supplementary note 9) The monitoring system according to supplementary note 6, wherein the power storage system includes a plurality of cell stacks connected in parallel with one another, the detection means detects that an insulation resistance value of each of the plurality of cell stacks falls below a first reference value, when an insulation resistance value of the cell stack falls below the first reference value, the specifying means acquires an execution time of cell balancing in each of a plurality of cells included in the cell stack falling below the first reference value, and when an execution time of the cell balancing exceeds a third reference value, specifies that a ground fault occurs, and the cell balancing is processing of discharging from each of the plurality of cells until a cell voltage reaches an intended value.

(Supplementary note 10) The monitoring system according to supplementary note 9, wherein, when an insulation resistance value of the cell stack falls below the first reference value, the specifying means acquires an execution time of the cell balancing in each of a plurality of cells included in the cell stack falling below the first reference value, and specifies that one or more ground faults a number of which is a number of one or more of the cells in each of which an execution time of the cell balancing exceeds the third reference value occur.

(Supplementary note 11) The monitoring system according to supplementary note 7 or 8, wherein, when an insulation resistance value of the cell stack falls below the first reference value but no voltage value of any of the cells included in the cell stack falling below the first reference value falls below the second reference value, the specifying means outputs a request for maintenance.

(Supplementary note 12) The monitoring system according to supplementary note 2 or any one of supplementary notes 6 to 11, wherein the specifying means specifies at least either one of a communication failure and a gas leak.

(Supplementary note 13) The monitoring system according to supplementary note 2 or any one of supplementary notes 6 to 12, wherein the monitoring system includes a plurality of devices configured to be mutually communicable, and the specifying means specifies that a communication failure occurs in the power storage system.

(Supplementary note 14) The monitoring system according to supplementary note 13, wherein, when a communication retry count in communication between the plurality of devices exceeds a fourth reference value, the specifying means specifies that a communication failure occurs in the power storage system.

(Supplementary note 15) The monitoring system according to supplementary note 13 or 14, wherein, when a communication failure in the power storage system is specified, the determination means determines an operation-continuable time of the power storage system after specification of the malfunction.

(Supplementary note 16) The monitoring system according to supplementary note 2 or any one of supplementary notes 6 to 15, wherein, when a ground fault in one location is specified, the determination means determines an operation-continuable time of the power storage system after specification of the malfunction.

(Supplementary note 17) The monitoring system according to supplementary note 15 or 16, further comprising monitoring means for executing monitoring processing of monitoring whether an operation duration time of the power storage system after specification of a malfunction exceeds the operation-continuable time, and when the operation-continuable time is exceeded, outputting a stop instruction for stopping an operation of the power storage system, wherein, when predetermined maintenance of the power storage system is executed, the monitoring means ends the monitoring processing.

(Supplementary note 18) The monitoring system according to any one of supplementary notes 1 to 17, further comprising a terminal device and a server, wherein
the terminal device includes the detection means,
the terminal device or the server includes the specifying means, and
the server includes the determination means.

(Supplementary note 19) The monitoring system according to supplementary note 18, wherein the terminal device or the server further includes
monitoring means for monitoring whether an operation duration time of the power storage system after specification of a prohibited action type exceeds the operation-continuable time, and when the operation-continuable time is exceeded, outputting a stop instruction for stopping an operation of the power storage system.

(Supplementary note 20) The monitoring system according to supplementary note 18 or 19, wherein the terminal device transmits a detection result by the detection means to the server.

(Supplementary note 21) The server comprised in the monitoring system according to any one of supplementary notes 18 to 20.

(Supplementary note 22) The terminal device comprised in the monitoring system according to any one of supplementary notes 18 to 20.

(Supplementary note 23) A monitoring method comprising:

detecting that a detection value related to a power storage system satisfies a condition;
specifying a type of a prohibited action executed in the power storage system satisfying the condition; and,
based on a specified prohibited action type, performing at least either of calculation of a lifetime of the power storage system and determination of an operation-continuable time of the power storage system after specification.

(Supplementary note 24) A storage medium having a program stored thereon, the program causing a computer to function as:

detection means for detecting that a detection value related to a power storage system satisfies a condition;
specifying means for specifying a type of a prohibited action executed in the power storage system satisfying the condition; and
determination means for, based on a specified prohibited action type, performing at least either of calculation of a lifetime of the power storage system and determination of an operation-continuable time of the power storage system after specification.

While the present invention has been described above with reference to the example embodiments, the present invention is not limited to the aforementioned example embodiments. Various changes and modifications that may be understood by a person skilled in the art may be made to the configurations and details of the present invention, within the scope of the present invention.

This application claims priority based on Japanese Patent Application No. 2016-228008 filed on Nov. 24, 2016, the disclosure of which is hereby incorporated by reference thereto in its entirety.

REFERENCE SIGNS LIST

1A Processor
2A Memory
3A Input-output interface
4A Peripheral circuit
5A Bus
1 Server
2 Terminal device
3 Power storage system
4 Monitoring computer
5 System controller
6 PCS
7 BMS
8 Battery
10 Monitoring system
11 Detection unit
12 Specifying unit
13 Determination unit
14 Monitoring unit

The invention claimed is:

1. A monitoring system of a power storage system, the monitoring system comprising:
a memory configured to store a program; and
a processor configured to execute the program so as to:
detect a detection value related to the power storage system, the detection value relating to a state of the power storage system;
specify a prohibited action executed in the power storage system when the processor determines that the detection value satisfies a first condition; and
perform at least either of calculation of a lifetime of the power storage system and determination of a future operation-continuable period of time of the power storage system from a time in which the specified prohibited action has occurred,
wherein the prohibited action is at least one of:
use of the power storage system for a purpose other than a predetermined purpose;
unauthorized alteration of the power storage system;
obstruction of a vent hole provided in the power storage system;
at least either one of a cumulative value of charged energy of the power storage system or a cumulative value of discharged energy of the power storage system in a predetermined period exceeding a predetermined upper limit;
a state of charge of the power storage system exceeding a predetermined upper limit;
the state of charge of the power storage system falling below a predetermined lower limit;
a temperature of the power storage system or a temperature of a room in which the power storage system is installed exceeding a predetermined upper limit;
stopping an air conditioner installed in the room in which the power storage system is installed;
moving an installation position of the power storage system from a set position;
lack of maintenance of the power storage system for a predetermined period of time; or a reset operation being performed a predetermined number of times or more.

2. The monitoring system according to claim 1,
wherein the processor is further configured to specify a malfunction occurring in the power storage system when the processor determines that the detection value satisfies the first condition, and
the processor is configured to calculate the lifetime of the power storage system based on a duration time of at least either one of the specified prohibited action or the specified malfunction.

3. The monitoring system according to claim 1,
wherein the processor is configured to monitor an operation duration time of the power storage system from the time in which the specified prohibited action has occurred, and
when the processor determines that the monitored operation duration time exceeds the future operation-continuable period of time, the processor outputs a stop instruction for stopping an operation of the power storage system.

4. The monitoring system according to claim 1,
wherein the power storage system stops in response to detection of a predetermined event and cancels a stoppage in response to a reset operation after the stoppage, and
the processor is configured to monitor a number of times of the reset operation.

5. The monitoring system according to claim 2,
wherein the processor is configured to specify that a ground fault occurs in the power storage system as the malfunction.

6. The monitoring system according to claim 5,
wherein the power storage system includes a plurality of cell stacks connected in parallel with one another,
the processor is further configured to detect that an insulation resistance value of each of the plurality of cell stacks falls below a first reference value,
when the processor determines that the insulation resistance value of a first cell stack of the plurality of cell stacks falls below the first reference value, the processor is configured to acquire a voltage value of each of a plurality of cells included in the first cell stack, and
when the voltage value falls below a second reference value, the processor specifies that the ground fault occurs.

7. The monitoring system according to claim 6,
wherein, when the insulation resistance value of the first cell stack falls below the first reference value, the processor acquires the voltage value of each of the plurality of cells included in the first cell stack and specifies a number of the ground fault, and
the number of the ground fault corresponds to a number of the plurality of cells in which the voltage value falls below the second reference value.

8. The monitoring system according to claim 5,
wherein the power storage system includes a plurality of cell stacks connected in parallel with one another,
the processor is further configured to detect that an insulation resistance value of each of the plurality of cell stacks falls below a first reference value,
when the processor determines that the insulation resistance value of a first cell stack of the plurality of cell stacks falls below the first reference value, the processor is configured to acquire an execution time of cell balancing in each of a plurality of cells included in the first cell stack, when the processor determines that the execution time of the cell balancing exceeds a third reference value, the processor specifies that the ground fault occurs, and
the cell balancing is processing of discharging from each of the plurality of cells until a cell voltage reaches an intended value.

9. The monitoring system according to claim 8,
wherein, when the insulation resistance value of the first cell stack falls below the first reference value, the processor acquires the execution time of the cell balancing in each of the plurality of cells included in the first cell stack and specifies a number of the ground fault, and
the number of the ground fault corresponds to a number of the plurality of cells in which the execution time of the cell balancing exceeds the third reference value.

10. The monitoring system according to claim 6,
wherein, when the insulation resistance value of the first cell stack falls below the first reference value but no voltage value of any of the plurality of cells included in the first cell stack falls below the second reference value, the processor outputs a request for maintenance.

11. The monitoring system according to claim 2,
wherein the processor specifies at least either one of a communication failure or a gas leak.

12. The monitoring system according to claim 2,
wherein the monitoring system includes a plurality of devices configured to be mutually communicable, and
the processor specifies that a communication failure occurs in the power storage system as the malfunction.

13. The monitoring system according to claim 12,
wherein, when the processor determines that a communication retry count in communication between the plurality of devices exceeds a fourth reference value, the processor specifies that the communication failure occurs in the power storage system.

14. The monitoring system according to claim 12,
wherein, when the processor specifies that the communication failure occurs in the power storage system, the processor determines the future operation-continuable period of time of the power storage system from a time in which the malfunction has occurred.

15. The monitoring system according to claim 2,
wherein the power storage system includes a plurality of cell stacks connected in parallel with one another, and
when the processor is configured to specify that a ground fault occurs in one location of the plurality of cell stacks as the malfunction, the processor determines that the future operation-continuable period of time of the power storage system from a time in which the malfunction has occurred.

16. The monitoring system according to claim 14,
wherein the processor is configured to monitor an operation duration time of the power storage system from the time in which the malfunction has occurred,
when the processor determines that the monitored operation duration time exceeds the future operation-continuable period of time, the processor outputs a stop instruction for stopping an operation of the power storage system, and
when the processor executes predetermined maintenance of the power storage system, the processor ends to monitor the operation duration time of the power storage system.

17. The monitoring system according to claim 1, further comprising:
a terminal device; and a server, wherein the terminal device is configured to determine whether the detection value satisfies the first condition, the terminal device or the server is configured to specify the prohibited action executed in the power storage system, and the server is configured to perform at least either of calculation of the lifetime of the power storage system and determination of the future operation-continuable period of time of the power storage system from the time in which the specified prohibited action has occurred.

18. A monitoring method of a power storage system for causing a processor to execute a program stored in a memory, the monitoring method comprising executing on the processor the steps of:

detecting a detection value related to a to the power storage system, the detection value relating to a state of the power storage system;

specifying a prohibited action executed in the power storage system when the processor determines that the detection value satisfies a first condition; and performing at least either of calculation of a lifetime of the power storage system and determination of a future operation-continuable period of time of the power storage system from a time in which the specified prohibited action has occurred, wherein the prohibited action is at least one of:

use of the power storage system for a purpose other than a predetermined purpose;

unauthorized alteration of the power storage system;

obstruction of a vent hole provided in the power storage system;

at least either one of a cumulative value of charged energy of the power storage system or a cumulative value of discharged energy of the power storage system in a predetermined period exceeding a predetermined upper limit;

a state of charge of the power storage system exceeding a predetermined upper limit;

the state of charge of the power storage system falling below a predetermined lower limit;

a temperature of the power storage system or a temperature of a room in which the power storage system is installed exceeding a predetermined upper limit;

stopping an air conditioner installed in the room in which the power storage system is installed;

moving an installation position of the power storage system from a set position;

lack of maintenance of the power storage system for a predetermined period of time; or a reset operation being performed a predetermined number of times or more.

19. A computer program product embodying computer readable instructions stored on a non-transitory computer-readable medium for causing a computer to execute a process by a processor so as to perform the steps of:

detecting a detection value related to a power storage system, the detection value relating to a state of the power storage system;

specifying a prohibited action executed in the power storage system when the processor determines that the detection value satisfies a first condition; and performing at least either of calculation of a lifetime of the power storage system and determination of a future operation-continuable period of time of the power storage system from a time in which the specified prohibited action has occurred, wherein the prohibited action is at least one of:

use of the power storage system for a purpose other than a predetermined purpose;

unauthorized alteration of the power storage system;

obstruction of a vent hole provided in the power storage system;

at least either one of a cumulative value of charged energy of the power storage system or a cumulative value of discharged energy of the power storage system in a predetermined period exceeding a predetermined upper limit;

a state of charge of the power storage system exceeding a predetermined upper limit;

the state of charge of the power storage system falling below a predetermined lower limit;

a temperature of the power storage system or a temperature of a room in which the power storage system is installed exceeding a predetermined upper limit;

stopping an air conditioner installed in the room in which the power storage system is installed;

moving an installation position of the power storage system from a set position;

lack of maintenance of the power storage system for a predetermined period of time; or a reset operation being performed a predetermined number of times or more.

* * * * *